United States Patent [19]

Remo

[11] Patent Number: 5,132,105
[45] Date of Patent: Jul. 21, 1992

[54] MATERIALS WITH DIAMOND-LIKE PROPERTIES AND METHOD AND MEANS FOR MANUFACTURING THEM

[75] Inventor: John L. Remo, St. James, N.Y.
[73] Assignee: Quantametrics, Inc., St. James, N.Y.
[21] Appl. No.: 576,581
[22] Filed: Aug. 31, 1990

Related U.S. Application Data

[63] Continuation-in-part of Ser. No. 474,276, Feb. 2, 1990, abandoned.

[51] Int. Cl.⁵ .................................................. B01J 3/06
[52] U.S. Cl. ..................................... 423/446; 423/445; 423/499; 156/DIG. 68; 427/39; 118/715; 118/716
[58] Field of Search ........................ 423/445, 449, 446; 156/DIG. 64; 427/39, 113; 118/715, 716

[56] References Cited

U.S. PATENT DOCUMENTS

| | | | |
|---|---|---|---|
| 4,495,044 | 1/1985 | Banks | 423/446 |
| 4,859,493 | 8/1989 | Lemelson | 423/446 |
| 4,871,581 | 10/1989 | Yamazaki | 423/446 |
| 4,915,977 | 4/1990 | Okamoto et al. | 423/446 |
| 4,922,827 | 5/1990 | Remo | 102/496 |

OTHER PUBLICATIONS

First International Conference on the New Diamond Science and Technology, Oct. 24-26, 1988, Keidanren Kaikan, Tokyo, Japan, pp. 36, 40, 42, 104, 106, 122, 126, 130, 208.
Kroto, "Space, Stars, $C_{60}$ and Soot", Science, vol. 242, Nov. 25, 1988, pp. 1139-1145.
Vaughen, "Tracking an Elusive Carbon", Science News, vol. 13, Jan. 28, 1989, pp. 56 to 57.
Schmalz et al., "Elemental Carbon Cages", Journal American Chemistry Society, 1988, vol. 110, pp. 1113-1127.

Primary Examiner—Robert Kunemund
Attorney, Agent, or Firm—Stanger, Michaelson, Spivak & Wallace

[57] ABSTRACT

Diamonds or diamond like substances are formed by breaking covalent bonds of fullerene and/or azite particles in the presence of carbon containing gases to form tetrahedral diamond like structures.

20 Claims, 11 Drawing Sheets

MATERIALS WITH DIAMOND-LIKE PROPERTIES AND METHOD AND MEANS FOR MANUFACTURING THEM

RELATED APPLICATIONS

This is a Continuation-in-Part of an application entitled "Materials with Diamond-Like Properties and Method and Means for Manufacturing Them", filed Feb. 2, 1990 in the name of John L. Remo (Ser. No. 474,276), now abandoned.

BACKGROUND OF THE INVENTION

This invention relates to materials having diamond-like properties and methods and means for manufacturing them, and particularly to materials which combine the tetrahedral structure of diamonds with other carbon structures.

Diamond is the hardest naturally occurring substance, is chemically almost inert, exhibits dielectric characteristics at room temperature, and furnishes a heat conductivity greater than that of copper. Diamond constitutes a dense array of carbon atoms joining other carbon atoms arranged tetrahedrally around a central atom. This contrasts with other carbon compounds such as a graphite which is composed of hexagonal layers of carbon atoms such as chicken wires which can slide over each other.

Because diamond is comparatively rare and offers the potential of a multitude of industrial uses, a number of attempts have been made to manufacture diamonds synthetically or to combine the tetrahedral carbon structure of diamonds with other carbon compounds. However, the resulting manufacturing schemes and materials have been comparatively expensive and limited the use of diamond-like materials for industrial purposes.

Some attempts to manufacture such materials have been unsuccessful because of the difficulty of synthesizing the diamond structure upon other carbon compounds.

OBJECT AND SUMMARY OF THE INVENTION

An object of the invention is to overcome the aforementioned difficulties.

Another object of the invention is to furnish improved materials having diamond-like characteristics and methods and apparatuses for furnishing them.

According to the invention, these objects are attained, in whole or in part, by heating carbon compounds and hydrogen and applying these heated materials to a flow of fullerene and/or azite molecules.

These and other features of the invention are pointed out in the claims. Other objects and advantages of the invention will become evident from the following detailed description when read in light of the accompanying drawings.

DETAILED DESCRIPTION OF PREFERRED EMBODIMENTS

Figure 1:
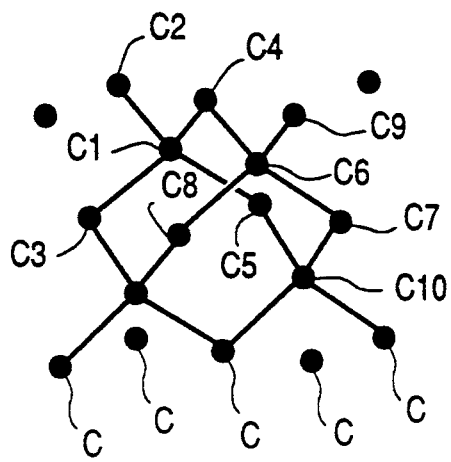
FIG. 1 is a schematic showing of a plurality of diamond molecules.

FIG. 1 illustrates a number of diamond molecules Here, all the atoms are carbon atoms and designated with the letter C, although some are followed by numerals The carbon atom C1 forms the center of a tetrahedral structure including carbon atoms C2, C3, C4, and C5. Similarly, the carbon atom C6 forms the center of a tetrahedral structure which includes carbon atoms C4, C7, C8, and C9. Carbon atom C10 also represents the center of a tetrahedral structure The diamond of FIG. 1 is composed of a dense array of the carbon atoms C joined by strong bonds arranged tetrahedrally around each atom. Such material is hard enough to form the tips of drill heads and cutting tools. It exhibits high thermal conductivity and dielectric characteristics at room temperature.

Figure 2:
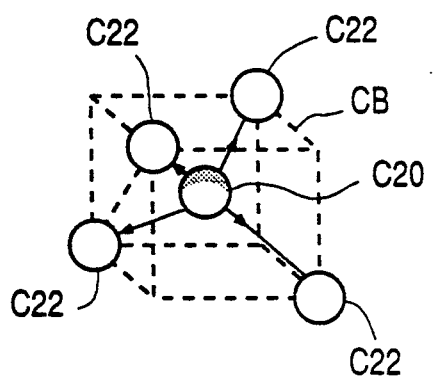
FIG. 2 is a schematic illustration of a diamond molecule.

FIG. 2 illustrates a conception of a single diamond molecule wherein a carbon atom C20 lies in the center of a cube CB and the surrounding carbon atoms fit into alternate corners of the cube.

Figure 3:
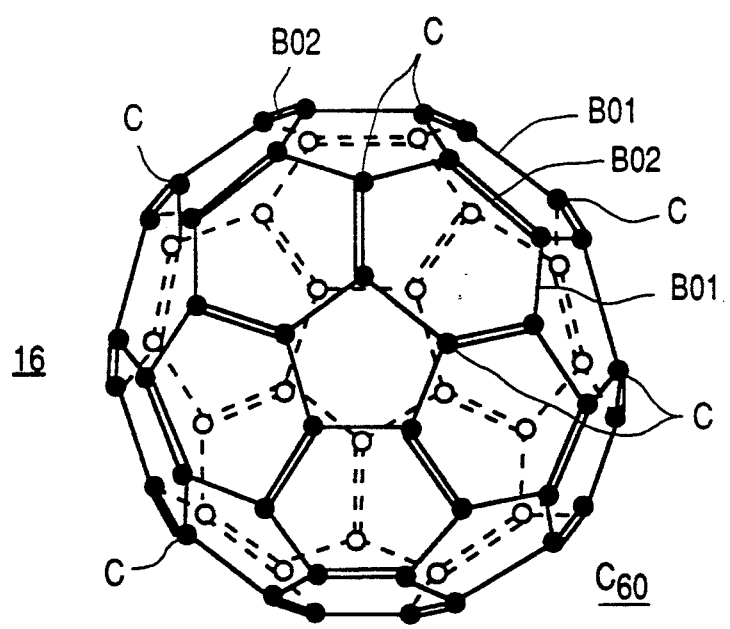
FIG. 3 is a schematic illustration of the molecule carbon-60 or $C_{60}$.

In FIG. 3, 60 carbon atoms C link with each other to form a nearly spherical molecule $C_{60}$ or carbon 60, having pentagonal and hexagonal faces. The $C_{60}$ has been dubbed "Buckminsterfullerene" and "Fullerene" because of its resemblance to the domes developed by Buckminster Fuller. Because the chemical bonds tie each carbon atom firmly to three others, it is stable and extremely difficult to tear apart. Single bonds BO1 and double bonds BO2 bond each of the carbon atoms in the carbon 60 molecule to three adjacent atoms. Two of the bonds are single bonds BO1 and one of the bonds are double bonds or covalent bonds BO2.

The invention uses hydrogen to break one or more of the covalent bonds BO2 of the C-60 molecule which ultimately allows a carbon bond to occur between carbon atoms on the surface of the carbon 60 and new tetrahedral structures growing out of the newly formed bond. This allows diamond crystals to form on the outside surface of the fullerene.

Figure 4:
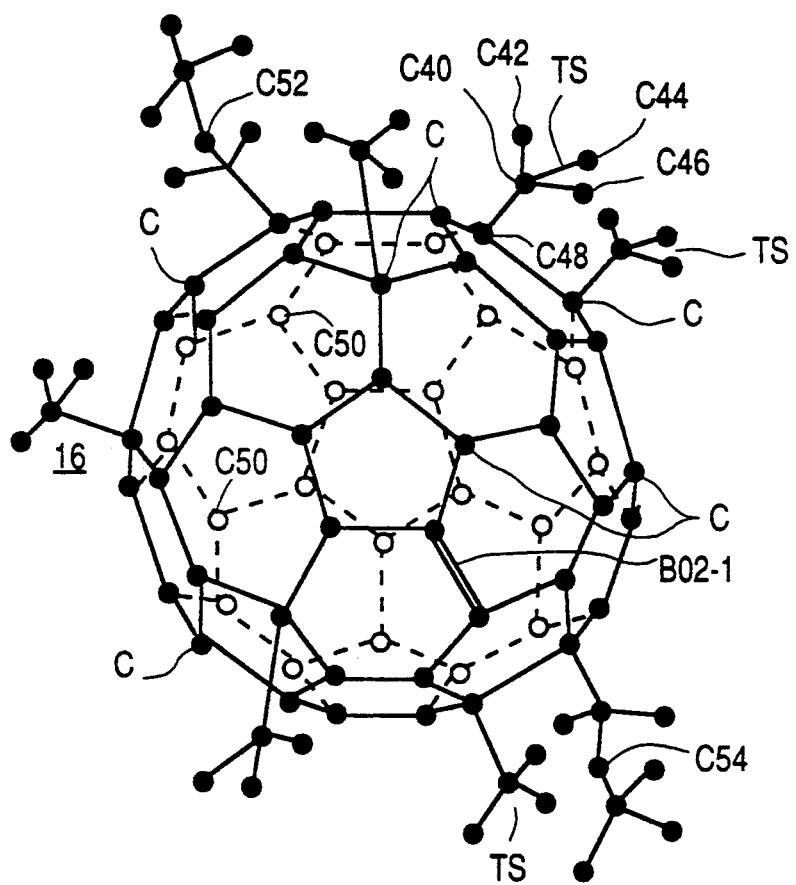
FIG. 4 is a schematic diagram showing the manner in which diamonds and diamond-like structures are formed from a fullerene molecule.

FIG. 4 illustrates tetrahedral structures TS i.e. diamonds growing out of the broken covalent bonds from a number of the carbon atoms C in the fullerene molecule. Each tetrahedral structure includes five carbon atoms C (and Cn, n=1, 2, 3, 4...) wherein C40 is the central carbon atom, the atoms C42, C44, C46, and C48 the outer atoms. The atom C48 constitutes the carbon atom which is both part of the structure TS and the fullerene molecule. The bond BO1 between the atoms C40 and C48 represents a single bond which previously formed a covalent bond that bonded two carbon atoms within the fullerene molecule.

As the tetrahedral bond is formed and the covalent bond broken, the fullerene structure may begin to unwind and break up. There exists one structure TS emerging from each pair of carbon atoms previously bonded with a covalent bond, i.e. one structure TS for each previous bond. Some or even most of the covalent bonds may remain unbroken and support no tetrahedral structure.

For simplicity, only the carbon atoms C at the front of the picture of the fullerene compound in FIG. 4 have tetrahedral structures growing thereon. However, it will be understood that other carbon atoms such as in the back of the picture of FIG. 4, such as the carbon atoms identified as C50 also have tetrahedral structures TS growing therefrom but these have been omitted for simplicity. The number of carbon atoms C carrying tetrahedral structures or diamond molecules may vary. Some of the carbon atoms such as C52 and C54 may grow further tetrahedral structures or diamond crystals. As the fullerene molecule breaks up, diamond crystals and other carbon atoms remain.

Figure 5:
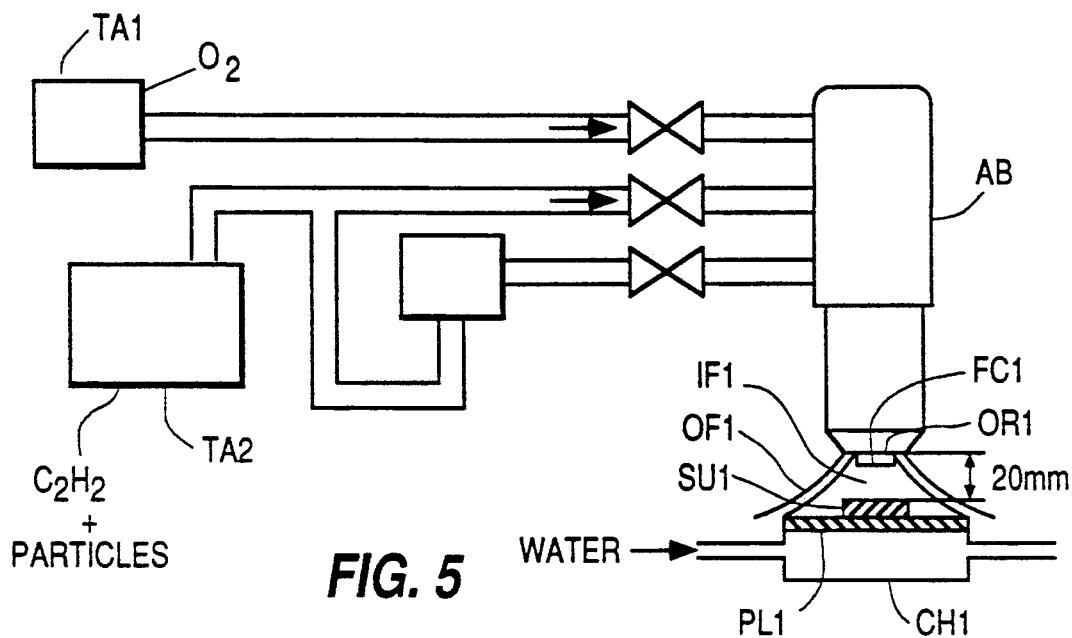
FIG. 5 is a schematic diagram of one means and method apparatus for forming diamonds and structures having diamond characteristics according to the invention.

FIG. 5 illustrates an apparatus for manufacturing the substance of FIG. 4. Here, an acetylene burner AB passes acetylene, namely $C_2H_2 + O_2$, from respective $O_2$ and $C_2H_2$ containers TA1 and TA2 under pressure toward an orifice OR1 to form a flame core FC1, an inner flame IF1, and an outer flame OF1. The container TA2 drives fullerene particles PA in a container TA3 so that the burner AB carries the fullerene particles PA into the flame. The temperature of the flame is preferably two thousand degrees centigrade, but may vary from 1500° C. to 3000° C.

Water passes through a cooling chamber CH1 which cools a copper plate PL1. The latter supports a Si or WC-Co alloy substrate SU1. The flame then converts some of the $C_2H_2$ molecules to tetrahedral diamond structures and breaks covalent bonds on the fullerene molecules to form diamond like structures. These are deposited on the substrate SU1.

Figure 6:
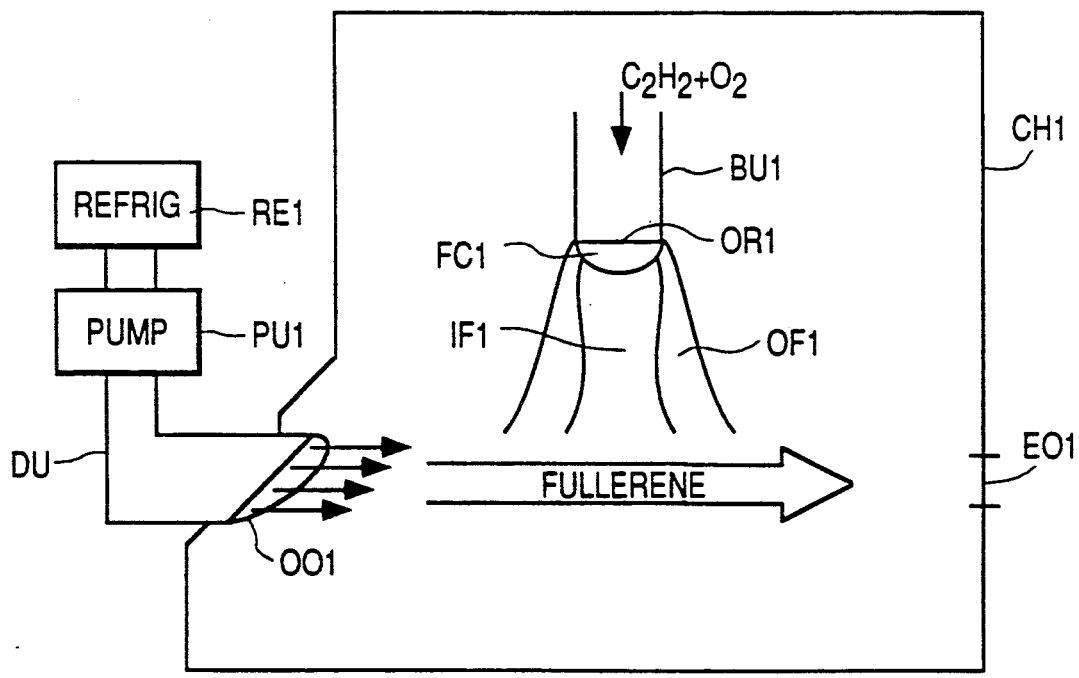
FIG. 6 is another apparatus for manufacturing diamond and diamond-like structures according to the invention.

FIG. 6 illustrates yet another method and apparatus embodying the invention and similar to that in FIG. 5. In FIG. 6, an acetylene burner AB passes $C_2H_2$ and $O_2$ toward an orifice OR1 to form the flame core FC1, the inner flame IF1 and the outer flame OF1. The temperature again is preferable 2000° C. but may vary from 1500° C. to 3000° C.

A pump PU1 pumps air carrying fullerene particles through a horizontally oval orifice OO1 through a duct DU past the inner and outer flame emerging from the burner BU1. The processed diamonds and/or diamond like structures pass out of an exit orifice EO1. The entire process occurs in a chamber CH1 which controls the flow of the substances According to an embodiment of the invention, the fullerene passes the inner and outer flames at a pressure of one atmosphere. However, according to other embodiments of the invention the pressure may be from two hundred Torr to three or four atmospheres. A refrigerant RI1 behind the pump PU1 cools the fullerene particles so they exhibit a surface temperature of from −60 to −100 degrees C. The ratio of $O_2$ to $C_2H_2$ is equal to or less than 1.

The rapid flow of fullerene past the flames avoids overheating The oval orifice OO1 produces fullerene flow in a flat sheet shape to serve as a nucleation substrate. The chemical flame deposition process of FIG. 6 produces diamonds and diamond-like structures through the unbonding process shown in FIG. 4.

In operation, the burner BU1 produces the flame cone FC1, the inner flame IF2, and the outer flame OF1. The refrigerator RE1 refrigerates the fullerene substances and the pump PU1 pumps the substances and refrigerated air through the horizontal oval orifice OO1 so that the fullerenes pass in a laminar flow through the inner flame IF1 and outer flame OF1 to produce the diamond and diamond like structures which exits from the chamber CH1 through an exit orifice EO1.

Figure 7:
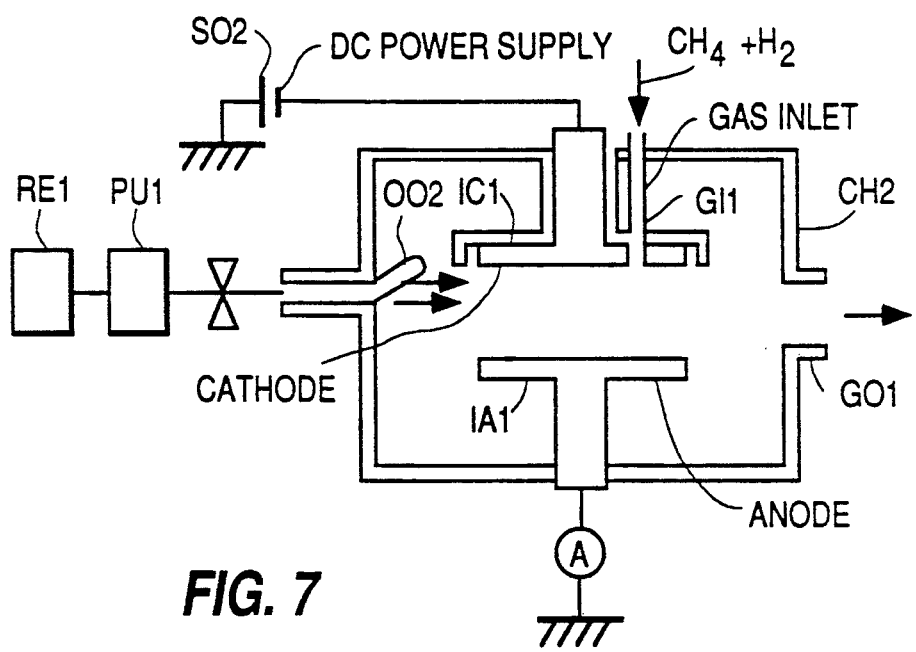
FIGS. 7 and 8 show other methods and means for manufacturing diamonds and diamond-like substances according to embodiments of the invention.

FIG. 7 illustrates yet another apparatus and means for producing the substance according to the invention. Here, a DC power source SO2 energizes an inner cathode IC1 and an inner anode IA1 which produce an arc discharge at a gas inlet GI1 of a chamber CH2 to produce a plasma jet in a chamber CH2. Gas composed of a mixture of $CH_4$ (2 vol %) and $H_2$, passes between the cathode IC1 and the anode IA1 into the arc discharge at the jet outlet GI1 and into the plasma jet. A pump PU1 forces fullerene refrigerated by refrigerator RE1, and air out of a horizontal oval orifice OO2 and through the plasma to produce the diamond and diamond like structures. The resulting gas and diamonds and diamond like structures pass out of a gas outlet GO1. A high density hydrocarbon and hydrogen plasma is generated by the arc discharge between the anode IA1 and cathode IA2.

According to an embodiment of the invention the pressure in the chamber CH2 is kept at between 100 to 500 Torr, preferably 200 Torr. The source SO2 produces a voltage between 0.7 KV to 1.5 KV, preferably 1 KV, to produce a discharge current density of 2 to 5 $A/cm^2$, preferably 3.5 $A/cm^2$. Temperatures 600° C. to 1200° C., preferably 800° to 900° C. prevail.

Figure 8:
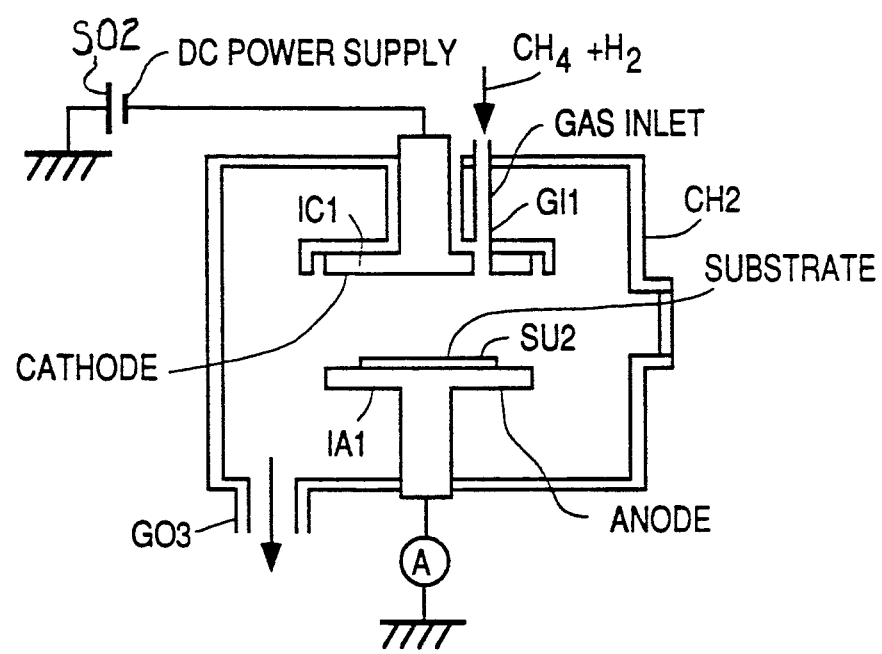

Another embodiment of the invention appears schematically in FIG. 8. Here, the deposition takes place upon a mirror polished Si(111) substrate SU2 in an environment similar to that of FIG. 7. Like parts are shown with like reference characters Here a DC power source SO2 energizes an inner cathode IC1 and an inner anode IA1 which produce an arc discharge at a gas inlet GI1 of a chamber CH2 to produce a plasma jet in a chamber CH2. Gas composed of a mixture of $CH_4$ (2 vol %) and $H_2$, as well as refrigerated fullerene passes between the cathode IC1 and the anode IA1 into the arc discharge at the jet outlet GI1 and into the plasma jet. A voltage between anode IA1 and cathode IC1 produces a plasma for depositing the diamond and diamond like structures from the gas inlet GI1 on the surface of the substrate SU2. The gas exits at the gas outlet GO3.

According to an embodiment of the invention the pressure in the chamber CH2 is kept at between 100 to 500 Torr, preferably 200 Torr. The source SO2 produces a voltage between 0.7 KV to 1.5 KV, preferably 1 KV, to produce a discharge current density of 2 to 5 A/cm$^2$, preferably 3.5 A/cm$^2$. Temperatures 600° C. to 1200° C., preferably 800° to 900° C. prevail.

According to an embodiment the flow rate of the gas plus fullerene mixture is 200 to 600 SCCM, preferably 400 SCCM.

In the aforementioned methods, the fullerene undergoes refrigeration and movement past the flame or plasma at a sufficient rate to prevent break-down of the fullerene.

Figure 9:
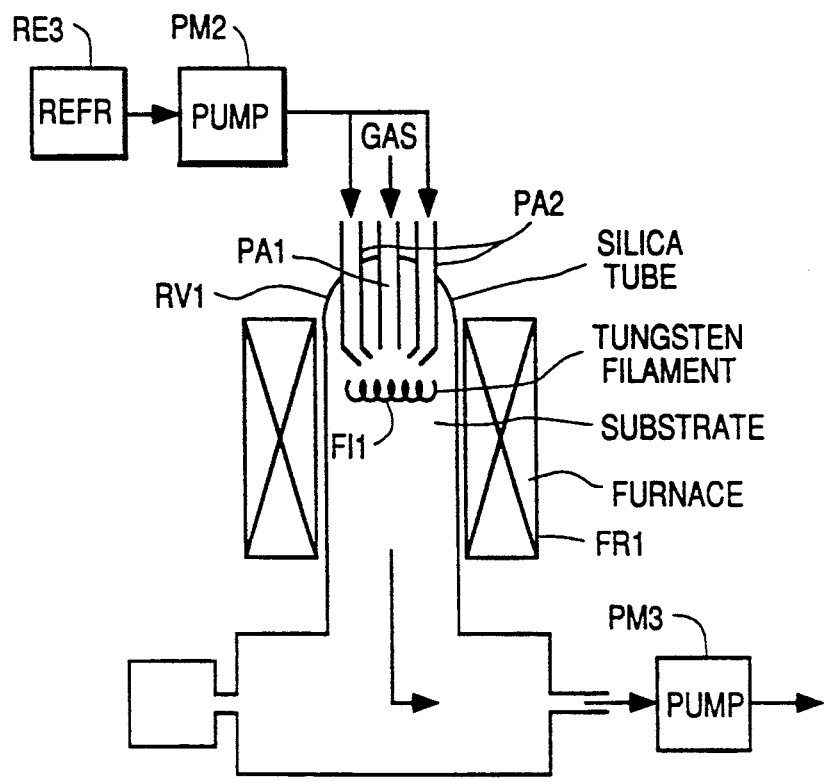
FIGS. 9 and 10 show still other methods and means for manufacturing diamonds and diamond-like substances according to embodiments of the invention.

FIG. 9 illustrates yet another embodiment of an apparatus for producing the substance according to the invention. Here, a passage PA1 passes a few percent of methane in hydrogen over a hot filament FI1 at a temperature of between 1500 and 2500 degrees C., preferably 2000 degrees C., in a silica tube reaction vessel RV1 within a furnace FR1 which heats the reaction vessel to 800 to 900 degrees C. A refrigerator RE3 cools the fullerene to a surface temperature of −60 to −100 degrees C. and a pump PM2 pumps the fullerene through the passages PA2 into the presence of the heated methane and hydrogen to produce the diamond and diamond like structures according to the invention. A pump PM3 pumps out the gases containing the diamonds and diamond like structures.

Figure 10:
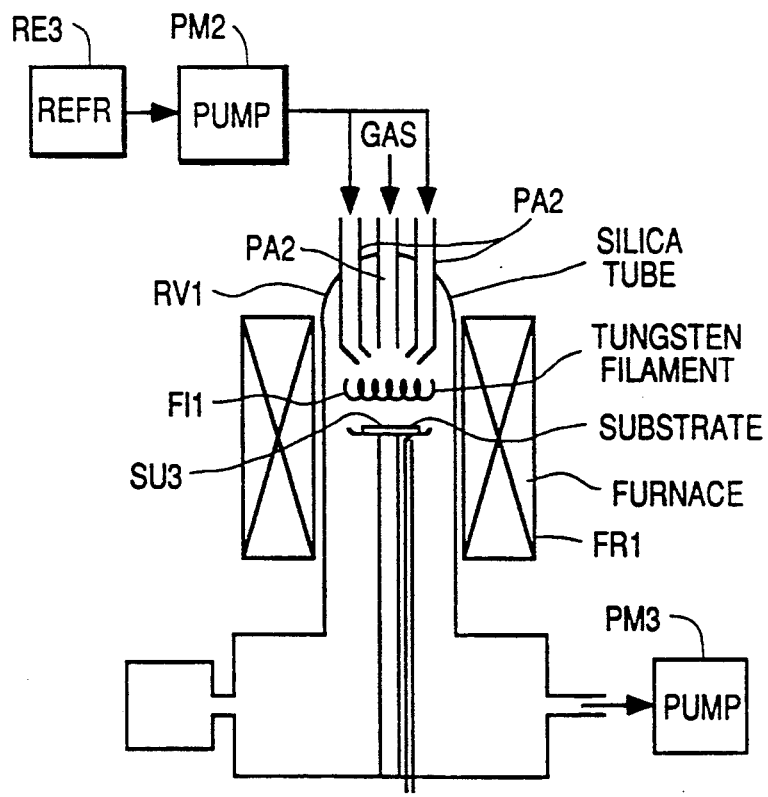

The embodiment of FIG. 10 deposits the diamonds and/or diamond like structures on a substrate SU3 in a device similar to that of FIG. 9. In the device of FIG. 10, like members carry the same reference characters as in FIG. 9. The main difference is in the substrate SU3.

According to an embodiment of FIG. 10, the reaction chamber used is a silica glass cylinder 0.4 m in length and 45 mm in diameter The polycrystalline graphite substrate surface of the substrate SU3 is mechanically polished. The deposition conditions are preferable substrate temperature 720° C. to 780° C., methane concentration 0.6%, total gas pressure 45.5 to 0.4 kpa, the reaction time 2 hours.

The atomic hydrogen may have the effect of removing graphite material that may form. The presence of atomic hydrogen atoms ties up the carbon bond as the film develops and allows SP3 (diamond-type) bonding as opposed to SP2 (graphite) bonding tetrahedral configuration of the free atoms.

In these embodiments it is believed that the heated and excited hydrogen atoms break the covalent carbon bonds in the fullerene molecules to allow SP3 bonding instead of SP2 bonding The term fullerene, as used herein, refers not only to the C$_{60}$ molecule, but also to all other carbon molecules which close into themselves such as C$_{72}$ and C$_{48}$.

Figure 11:
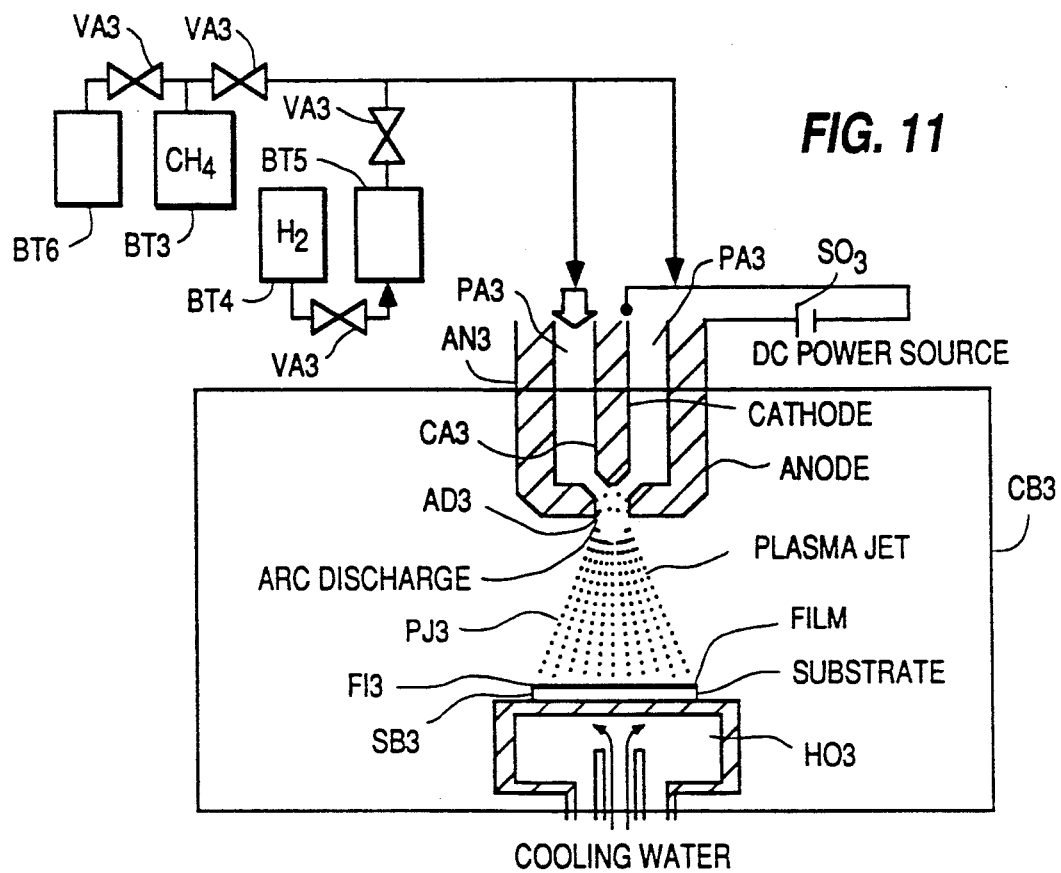
FIGS. 11 and 12 show yet other methods and means for manufacturing diamonds and diamond-like substances according to embodiments of the invention.
Figure 12:
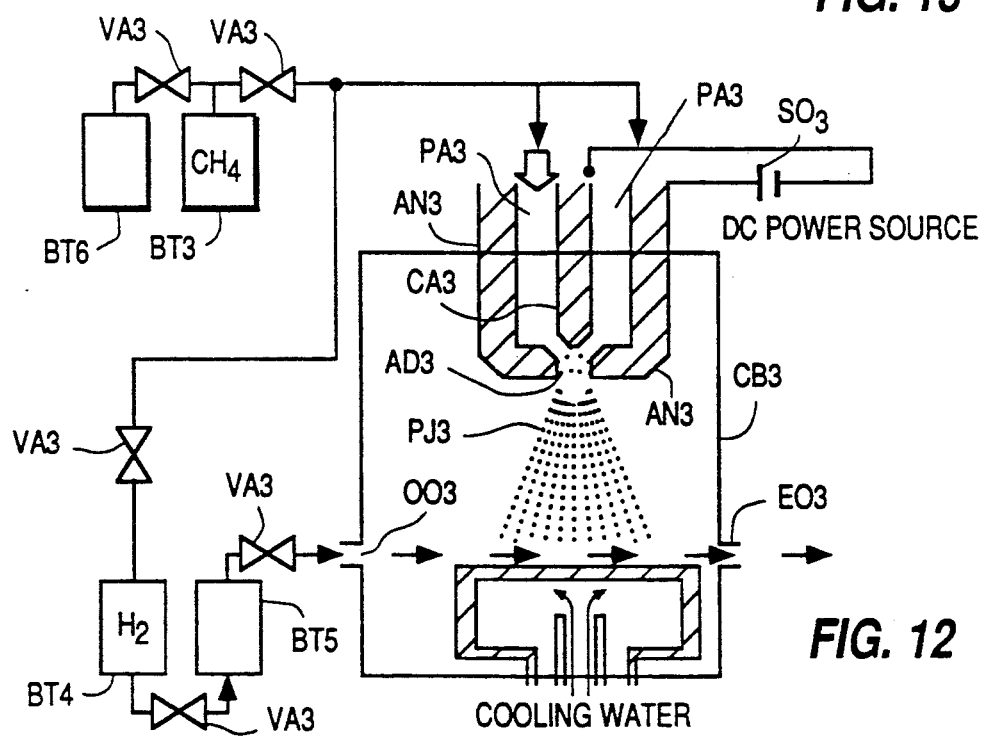

FIGS. 11 and 12 illustrate two other embodiments of the invention. Using DC plasma jet CVD. In these embodiments, a DC power source SO3 of 8 to 150 volts produces a 10 to 50 ampere arc discharge within a chamber CB3 and between a cathode CA3 and an anode AN3 cylindrically surrounding the cathode. A passage PA3 receives a mixture from compressed CH$_4$ in a bottle BT3 and hydrogen in a bottle BT4 which cools and carries fullerenes from a bottle BT5 to add to the mixture. The resulting mixture passes down the passages PA3 into the arc discharge to produce a plasma jet PJ3. In FIG. 11 a film FI3 composed of diamonds and/or diamond like structures and other carbon substances forms on a substrate SB3 on a holder HO3 which receives cooling water. According to another embodiment, added gases such as argon, helium, or combinations of these are added to the mixture of gases and fullerenes. Valves VA3 control the flow of gases.

In the operation of FIG. 11, the arc discharge AD3 between the anode AN3 and the cathode CA3 generates high density carbon plasma and hydrogen plasma. The following table shows the preparation conditions:

| | |
|---|---|
| Current (A) | 10–50 |
| Voltage (V) | 80–150 |
| Gas (1/min) | |
| CH$_4$ | 0.01–0.2 |
| H$_2$ | 10–50 |
| added gas | 0–20 |
| Pressure (Pa) | 30–300 Torr |

The added gases arrive from the bottle BT6 in the form of argon and helium. The substrate holder HO3 receives water cooling to avoid overheating the grown film. The plasma jet serves the purpose of growing the film FI3 in the form of diamonds and diamond like structures and broken fullerenes.

FIG. 12 differs from FIG. 11 in that the bottle BT4 of hydrogen passes the hydrogen directly to the passage PA3 along with the CH4 from the bottle BT3 and the added gases from the bottle BT6. A portion of the hydrogen from the bottle BT4 passes through the bottle BT5 containing the fullerenes through an oval orifice OO3 depicted in FIG. 13. The fullerenes pass through the plasma jet PJ3 of FIG. 12 at the exit orifice EO3. Passing the fullerene and trained hydrogen gas through the orifices OO3 and EO3 and through the plasma jet PJ3 is done for the purpose of producing diamonds and diamond like structures.

Figure 14:
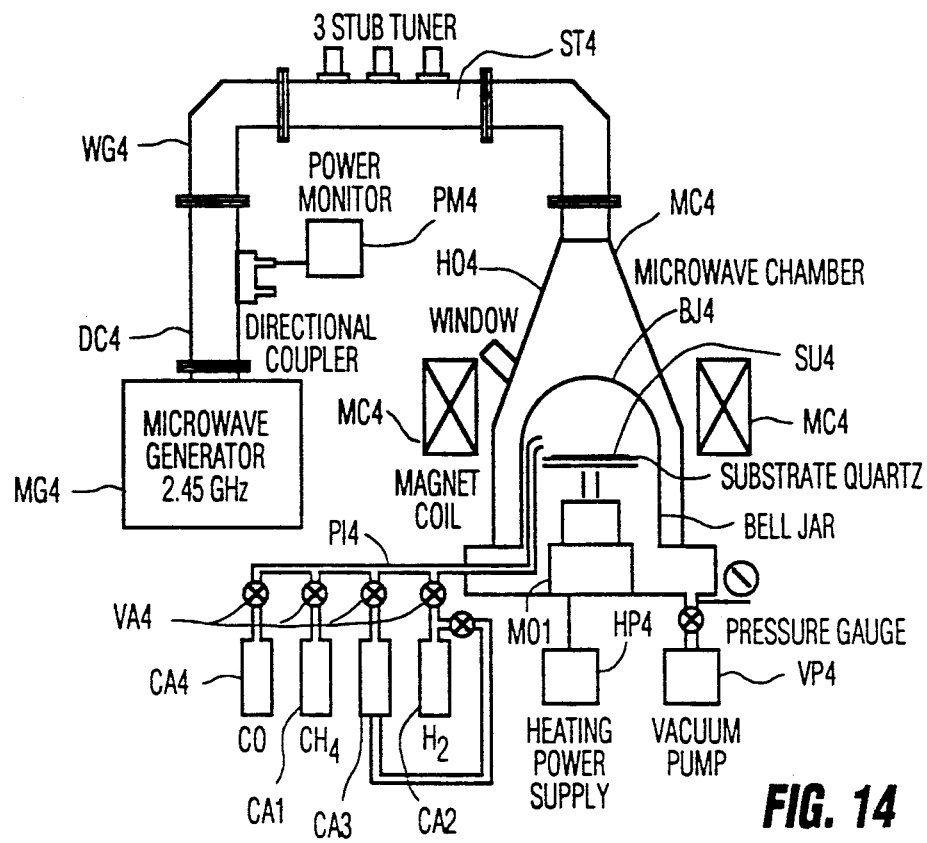
FIGS. 14 and 15 illustrate still other methods and means for manufacturing diamonds and diamond-like substances according to embodiments of the invention.
Figure 15:
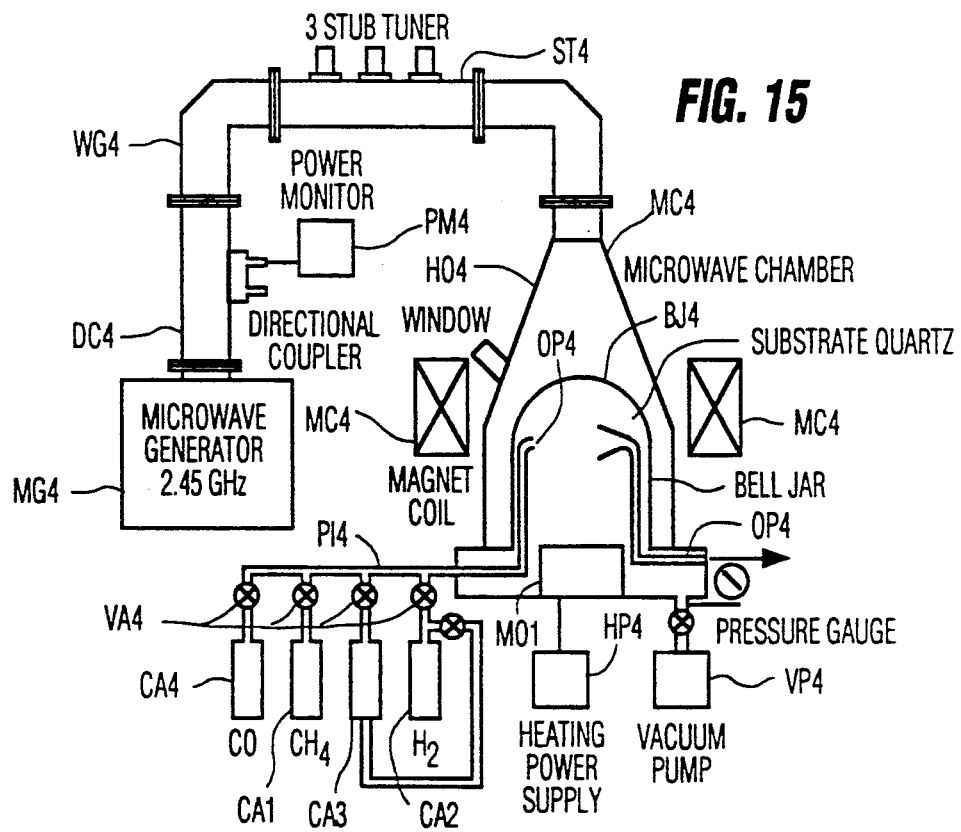

Yet another method and means for forming diamond-like substances and diamonds appear in FIGS. 14 and 15. These figures illustrate 2.4 GHz microwave plasma CVD systems for this purpose. FIG. 14 illustrates the system for large area diamond film deposition and FIG. 15. a system for producing gas and entrained diamond-like particles as well as diamonds. In both FIGS. 14 and 15, a horn type microwave chamber MC4 covers a quartz bell jar BJ4. In each figure, a waveguide WG4 transmits microwave energy from a microwave generator MG4 through a directional coupler DC4 monitored by a power monitor PM4 through a 3 stub tuner ST4. A horn HO4 gradually expands the waveguide WG 4 to the microwave chamber MC4 to reduce microwave reflection power. The gas from a canister CA1 of pressurized CH$_4$ joins the gas output of a canister CA2 of pressurized H$_2$ and enters the bell jar BJ 4 through a pipe PI4. A portion of the hydrogen from the canister CA2 drives fullerene molecules in a canister CA3 into the pipe PI4. The pressurized H$_2$ cools the fullerene particles. A heating power supply HP4 heats the inside of the bell jar by means of heating elements in the mounting MO1.

The microwave generator MG4 generates microwave power of 1 to 5 KW, preferably 2.5 to 3 KW and the gas flow is between 450 to 1000 SCCM with a gas pressure inside the bell jar of 40 Torr. The heating power supply HP4 produces a temperature between 6° and 1200° C. preferably 800° to 900° C. Energized magnet coils MC4 magnetically interact with the microwave energy from the microwave generator MG4.

In operation, the pressure from the canister CA1, CA2, and CA3 cause fullerenes and trained in the gases to pass through the pipe PI4 across the substrate SU4. At the same time, the microwave generator MG4 and the energized magnet coils MC4 produce microwave plasma in the bell jar BJ4 at the temperature produced by the heating power supply HP4 and at the pressure indicated. This serves for depositing diamonds and diamond like particles on the surface of the substrate SU4.

In FIG. 15, the pipe PI4 faces an output pipe OP4 with a funnel opening within the bell jar BJ4. The flow of gases and the gas entrained fullerene from the canister CA1, CA2, and CA3 passes through the pipe PI4 as the microwave generator and magnet coils MC4 produce a microwave plasma in the bell jar BJ4 at the temperature partially produced by the heating power supply HP4 and the aforementioned pressure. The interaction of the microwave energy, fullerene, and gases converts the fullerene particles and carbon in the gases to diamonds and or diamond like particles.

According to other embodiments of FIGS. 14 and 15, the magnet coils MC4 are not used. According to another embodiment of the invention a valve VA4 in series with the canisters CA4 of compressed carbon monoxide adds the carbon monoxide gas to the gases in the pipe PI4.

In these embodiments, the diamond and diamond like particles which are synthesized directly from carbons other than from the fullerenes, are synthesized from the vapor phase.

Figure 13:
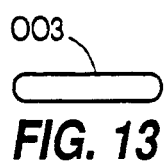
FIG. 13 is a schematic diagram of an orifice in FIG. 12.

According to another embodiment of the invention, the pipe PI4 terminates in an opening OP4 having the shape shown in FIG. 13 by the orifice OO1.

Figure 16:
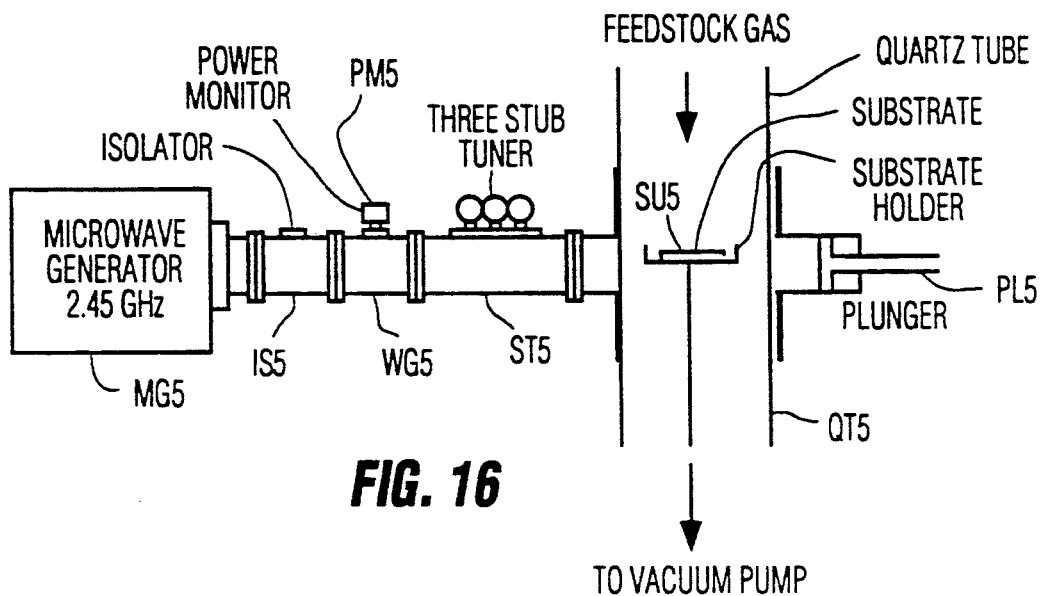
FIGS. 16 and 17 illustrate still other methods and means for manufacturing diamonds and diamond-like substances according to embodiments of the invention.
Figure 17:
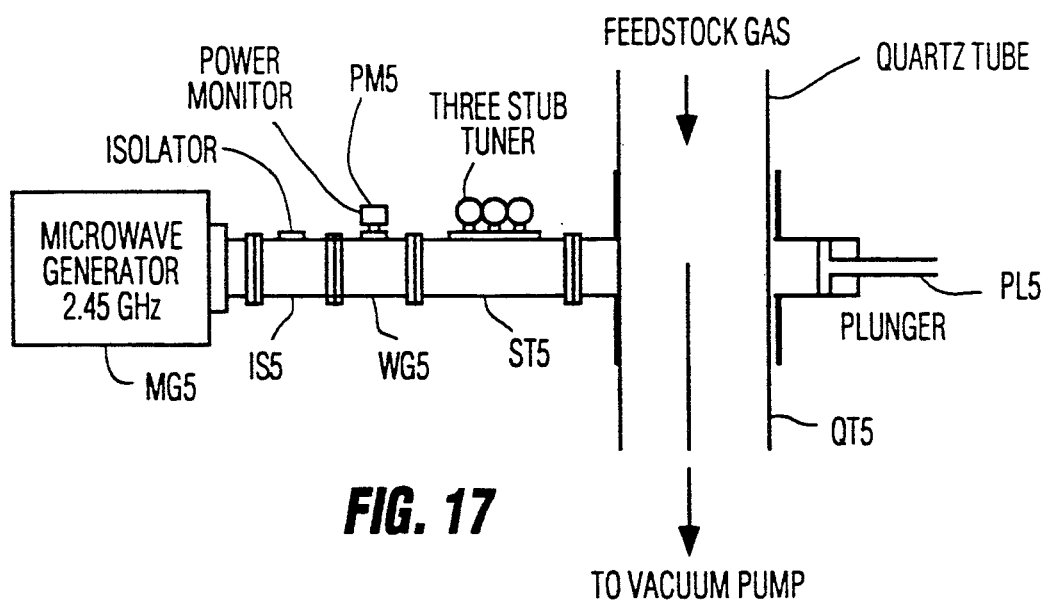

FIGS. 16 and 17 illustrate other embodiments of the invention also using plasma CVD apparatus. In FIGS. 16 and 17, a microwave generator of 2.45 GHz generates energy which a waveguide WG5 passes through an isolator IS5, by a power monitor PM5, and past a three stubbed tuner ST5 to form a plasma in a quartz tube QT5. The tube QT5 passes feed stock gas in the form of CO and $H_2$ which entrains fullerene particles. The gas and the fullerene particles are drawn down by a vacuum pump past the plasma formed by the generator MG5. A plunger PL5 varies the operation of the plasma formed by the generator. In FIG. 16, a substrate serves to collect the results of the operation. In FIG. 17, the results of the operation leave in the form of a dust collected outside the quartz tube.

In the operation of FIG. 16, the feed stock gas passes through the plasma formed by the microwave generator MG5 and the fullerenes and carbons within the gas form the diamond-like substances as well as diamond upon a substrate SU5.

In the operation of FIG. 17 the feed stock gas with its fullerene particles passes through the plasma formed by the generator MG5 and the plasma converts the constituents of the gas to diamond and/or diamond like particles from the broken fullerenes.

Figure 18:
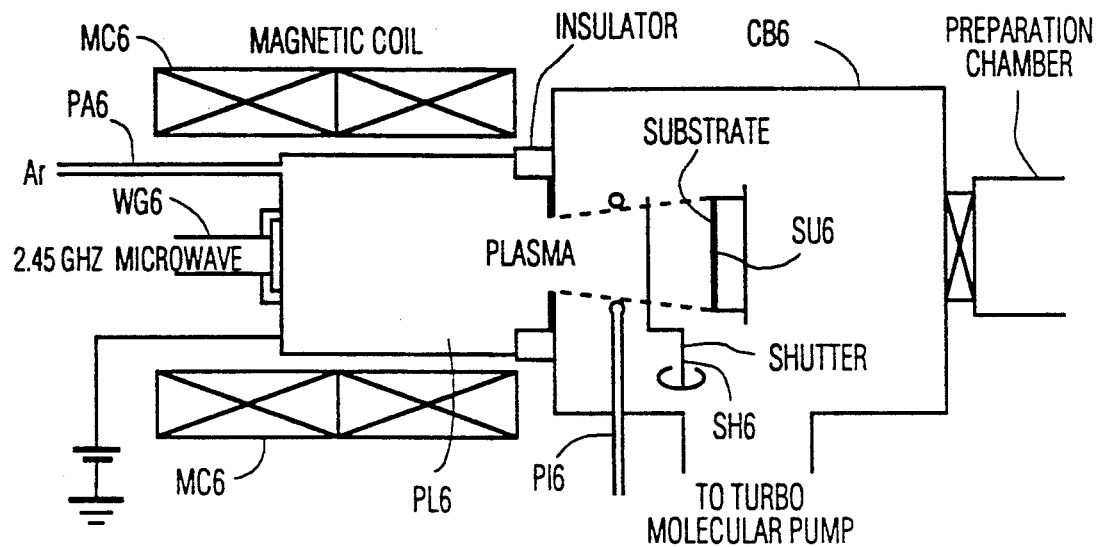
FIGS. 18 and 19 illustrate still other methods and means for manufacturing diamonds and diamond-like substances according to embodiments of the invention.
Figure 19:
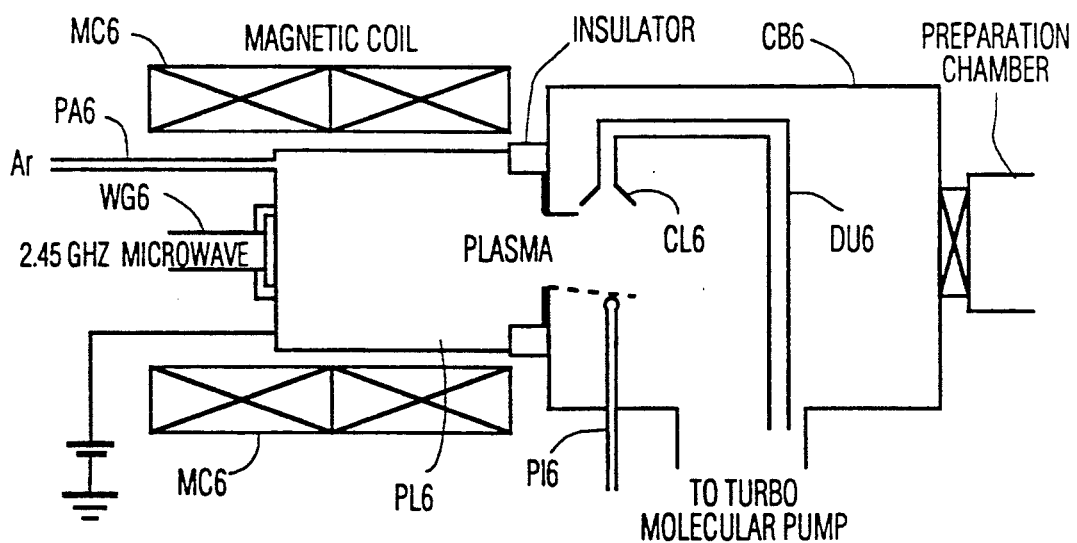

FIGS. 18 and 19 illustrate other embodiments of the invention using ultra high frequency electron cyclotron resonance chemical vapor formation of diamond and/or diamond-like substances. In FIGS. 18 and 19, a pipe PI6 corresponding to the pipe PI4 of FIGS. 14 and 15 carries gases from canisters corresponding to the canisters CA1, CA2, and CA3 and containing $CH_4$ hydrogen, and fullerene through a plasma PL6. A 2.5 GHz microwave waveguide WG6 transmits the energy to generate the plasma in a chamber CB6 evacuated by a 550 L/s turbo molecular pump down to $2 \times 10^{-9}$ Torr.

Magnetic coils MC6 bias the magnetic cavity in which the plasma is formed. A passage PA6 passes argon into the plasma the diamond and/or diamond like substance are formed by ultra high vacuum electron cyclotron resonance chemical vapor deposition (UHV-VCR-CVD). The system includes an ECR ion source IS6, the formation chamber CB6. The ECR ion source operates under the magnetic field produced by the magnetic coils MC6 in the amount of 600 to 1100 Gauss and the microwave frequency between 2 and 3 GHz, preferably 2.45 GHz. The ECR cavity is insulated from the grounded chamber by a vacuum ring and the plus biased voltage of the ECR cavity accelerates the ions toward the substrate. The substrate temperature is between 100° and 500° C., preferably 200° to 300° C., the gas flow rate is preferably between 2 and 8 SCCM, preferably 5 SCCM and the pressure in the chamber CB6 between 3 and $7 \times 10^{-4}$ torr, preferably $5 \times 10^{-4}$ torr. The microwave power is between 30 and 200 watts and the cavity bias between zero and 500 volts, preferably between zero and 250 volts. In operation, in FIG. 18, the gas entrained fullerenes pass through the pipe PI6 and are deposited upon a substrate SU6 in the chamber CB6 when a shutter SH6 is removed. In FIG. 19, a collector CL6 collects the diamond and/or diamond like particles formed and a duct DU6 passes them out pass the turbo molecular pump to a collection point.

Figure 20:
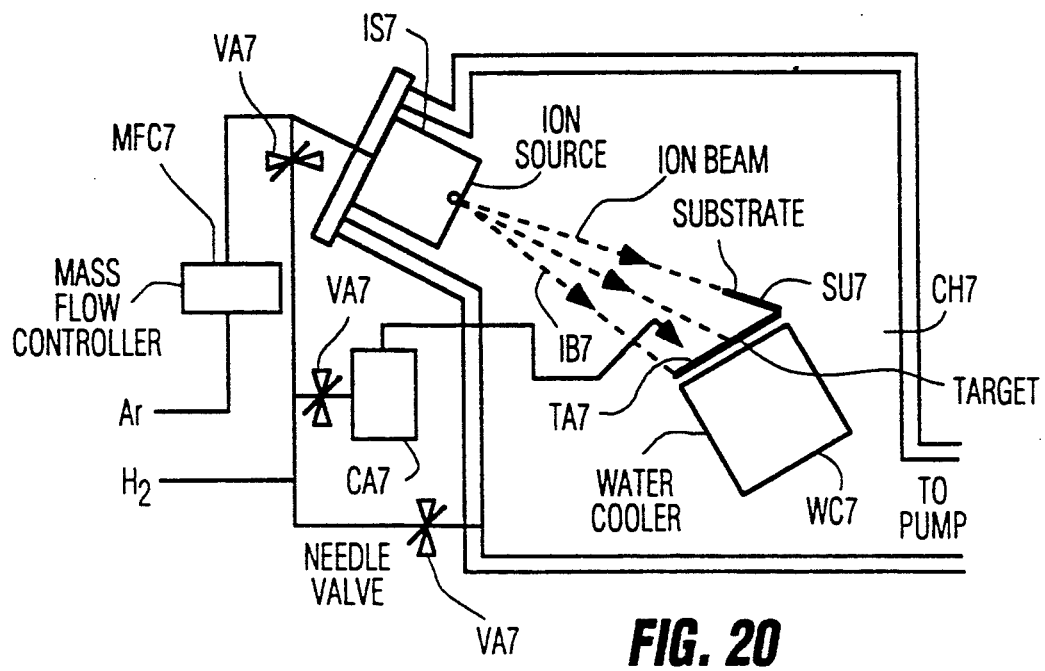
FIGS. 20 and 21 show still other methods and means for manufacturing diamonds and diamond-like substances according to embodiments of the invention.
Figure 21:
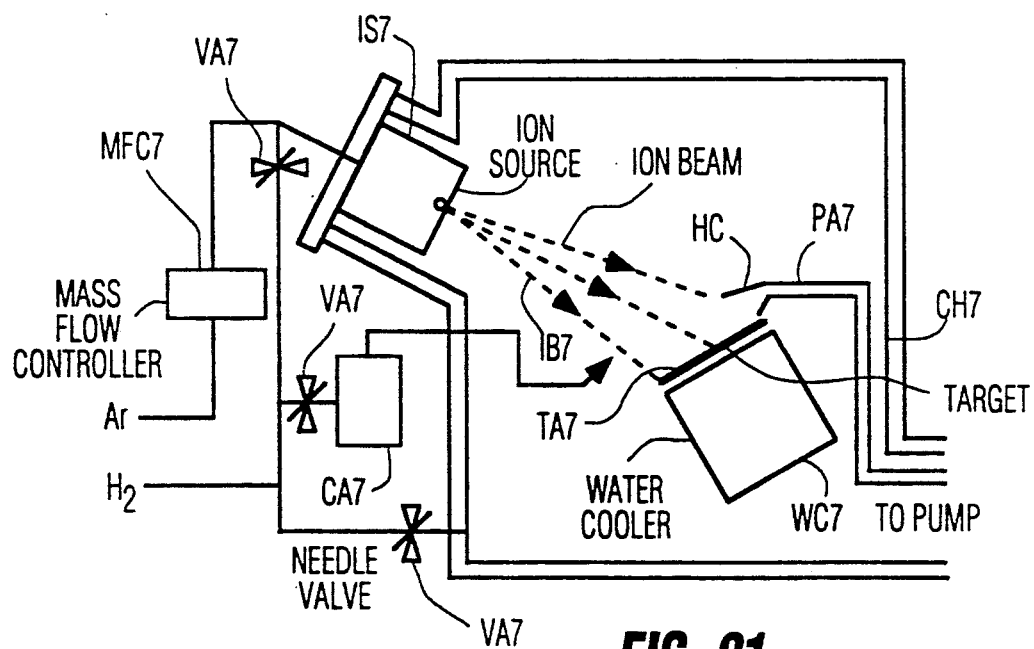

FIGS. 20 and 21 illustrate other embodiments of the invention using ion beam sputter techniques at room temperatures. Here, argon passes through a mass flow controller MFC7 to an ion source IS7. Needle valves VA7 introduce hydrogen gas to the ion source and to a canister CA7 containing fullerene The hydrogen carries the fullerene toward a substrate SU7. The ion source IS7 produces an ion beam IB7 directed at a graphite target TA7. In FIG. 20, a substrate SU7 extends substantially parallel to the ion beam. In FIG. 21, a horn collector HC draws the substances formed into a passage PA7 and out of the surrounding chamber CH 7.

In FIGS. 20 and 21 the electron ion bombardment source produces an ion beam IB7 directed toward the target TA7. A graphite disc is used as the target. Water cooling by water cooler WC7 keeps the target at room temperature.

The sputtering conditions appear in the following table. The growth rate is shown for the embodiment of FIG. 20.

| Target | Graphite plate |
| --- | --- |
| Target dimension | 100 mm in diameter |
| Ion source energy | 1200 eV |
| Ion source current | 60 mA |
| Ion source beam aperture | 25 mm in diameter |
| Gas pressure | $5 \times 10^{-5}$ $2 \times 10^{-4}$ torr |
| Target-ion source spacing | 250 mm |
| Growth rate | 300–400 nm/h |

In operation, argon and hydrogen gas are introduced to the ion source IS7 and the chamber CH7. The ion current densities are 0.5 to 2 $mA/cm^2$ at the target TA7.

In FIG. 20, the substrate SU7 is oriented almost parallel to the direction of the ion beam. This causes the ion beam IB7 to bombard the carbon film at a low angle during deposition. This bombardment creates localized and rapidly collapsing conditions of high temperature and high pressure. Diamond and diamond-like particles are synthesized and deposited on the substrate. The ion current density to the substrate is approximately 0.04 mA/cm$^2$. The ion beams converts the fullerenes to diamonds and diamond like substances which are deposited on the substrate.

In operation FIG. 21 operates in a manner similar to that of FIG. 20. However, the fullerenes emerging from the canister CA7 pass across the target and the horn collector HC collects the resulting substances. The ion beam converts the substances to diamonds and diamond like substance and broken down fullerene molecules in the form such as that illustrated in FIG. 4.

According to other embodiments of the invention azites are substituted for or added to the fullerenes in FIGS. 5 to 12 and 14 to 21. An azite is a black ceramic-like substance nearly as hard a quartz and less than half as dense. Azites are described in the issue of Science, Vol. 247, p. 161, Jan. 12, 1990, Research News by M. Michell Waldrop in an article entitled "What You Find When Looking for a Soccer Ball". the subject of the article was presented to The International Chemical Conference of Pacific Basin Societies, to Dec. 17 to 22, 1989 in Honolulu, Hi.

Fullerenes are described in Science, Volume 242, starting page 1139, dated Nov. 25, 1988 as well as in J. Chem. Phys. 90 (9), May 1, 1989, pages 4744 to 4771, in an article by David E Weeks and William G. Harter. entitled Rotation-vibration spectra of icosahedral molecules. II. Icosahedral symmetry, vibrational eigenfrequencies, and normal modes of buckminsterfullerene.

What is claimed is:

1. A material, comprising:
   a plurality of molecules;
   each of said molecules having a plurality of carbon atoms forming a fullerene or azite shape and a plurality of diamond molecules each having a carbon atom forming a bond to a carbon atom in said fullerene or azite molecule.

2. An apparatus for forming a material, comprising:
   flow means for forming a flow of fullerene or azite molecules and including fullerene or azite molecules;
   feeding means for subjecting the flow of fullerene molecules to intersect with a gas including carbon and hydrogen atoms; and
   means for subjecting said gas to temperatures above a given temperature.
   said flow means including means for refrigerating said fullerene or azite molecules.

3. A method for forming a diamond-fullerene or diamond-azite material, comprising:
   passing a gas stream including carbon and hydrogen atoms through a heating source; and
   passing a flow of fullerene or azite material through said heated gas stream.

4. A method as in claim 3, wherein said step of passing a gas stream through a heating source includes;
   heating with the heating source by combustion of the gas stream.

5. A method as in claim 3, wherein said step of passing a gas stream through a heating source includes:
   forming the gas stream from oxygen and acetylene.

6. A method as in claim 3, wherein said step of passing a gas stream through a heating source includes:
   maintaining the heating source between 1500 degrees C. and 3500 degrees C.

7. A method as in claim 3, further comprising:
   accumulating the result of passing the gas stream and passing the flow on a substrate adjacent the heating source.

8. A method as in claim 7, wherein the step of accumulating includes:
   cooling the substrate.

9. A method as in claim 3, wherein said step of passing a gas stream through a heating source includes:
   heating with the heating source by combustion of the gas stream and forming the gas stream from oxygen and acetylene.

10. A method as in claim 3, wherein said step of passing a gas stream through a heating source includes:
    heating with the heating source by combustion of the gas stream;
    forming the gas stream from oxygen and acetylene; and
    maintaining the heating source between 1500 degrees C. and 3500 degrees C.

11. A method as in claim 4, further comprising:
    accumulating result of passing the gas stream and passing the flow on a substrate adjacent the heating source.

12. A method as in claim 4, wherein said step of passing the flow includes cooling the material.

13. A method as in claim 3, wherein said step of passing a gas stream through a heating source includes:
    forming the heating source with a discharge plasma.

14. A method as in claim 13, wherein said step of passing the flow includes cooling the material.

15. A method as in claim 7, wherein the step of accumulating includes:
    cooling the substrate; and
    forming the heating source with a discharge plasma.

16. A method as in claim 3, wherein said step of passing a gas stream through a heating source includes:
    heating with the heating source by heating a filament.

17. A method as in claim 7, wherein the step of accumulating includes:
    cooling the substrate; and
    heating with the heating source with a heated filament.

18. A method as in claim 3, wherein said step of passing a gas stream though a heating source includes:
    heating with the heating source by means of an arc discharge that forms a plasma jet.

19. A method as in claim 3, wherein said step of passing a gas stream through a heating source includes:
    heating with the heating source in the form of a microwave generator.

20. A method as in claim 3, wherein said step of passing a gas stream through ah heating source includes:
    heating with eh heating source in the form of a microwave generator and a magnetic coil.

* * * * *